United States Patent
Hwang (10) Patent No.: US 8,851,875 B2
(45) Date of Patent: Oct. 7, 2014

(54) SEMICONDUCTOR PACKAGE MOLDING SYSTEM AND MOLDING METHOD THEREOF

(75) Inventor: Young-jin Hwang, Asan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 478 days.

(21) Appl. No.: 13/240,045

(22) Filed: Sep. 22, 2011

(65) Prior Publication Data

US 2012/0107436 A1 May 3, 2012

(30) Foreign Application Priority Data

Nov. 2, 2010 (KR) .................. 10-2010-0108404

(51) Int. Cl.
| | |
|---|---|
| B29C 45/14 | (2006.01) |
| B29C 70/72 | (2006.01) |
| H01L 21/56 | (2006.01) |
| B29C 45/00 | (2006.01) |
| B29C 45/42 | (2006.01) |
| B29C 45/38 | (2006.01) |

(52) U.S. Cl.
CPC .............. *H01L 21/565* (2013.01); *B29C 45/42* (2013.01); *B29C 45/0084* (2013.01); *B29C 45/4225* (2013.01); *H01L 2924/0002* (2013.01); *B29C 45/382* (2013.01)
USPC ........... 425/116; 425/121; 425/125; 425/215; 425/453; 425/544; 425/575

(58) Field of Classification Search
USPC .............. 425/116, 121, 126.1, 215, 223, 544, 425/575, 453, 125
See application file for complete search history.

(56) References Cited

U.S. PATENT DOCUMENTS

| | | | | |
|---|---|---|---|---|
| 5,750,059 | A | * 5/1998 | Bandoh | .......................... 425/190 |
| 5,842,257 | A | * 12/1998 | Tashima et al. | .......... 264/272.17 |
| 6,007,316 | A | * 12/1999 | Bandoh | .......................... 425/116 |
| 6,050,802 | A | * 4/2000 | Kobayashi | ..................... 425/116 |
| 6,814,556 | B2 | * 11/2004 | Hirano et al. | .................... 425/89 |
| 6,908,293 | B2 | * 6/2005 | Furuta et al. | ................... 425/116 |
| 2002/0171173 | A1 | * 11/2002 | Tsuchida | ...................... 425/226 |

FOREIGN PATENT DOCUMENTS

| | | |
|---|---|---|
| JP | 2004-266153 | 9/2004 |
| JP | 2008-028189 | 2/2008 |
| KR | 1020010027996 | 4/2001 |

* cited by examiner

*Primary Examiner* — Joseph S Del Sole
*Assistant Examiner* — Thu Khanh T. Nguyen
(74) *Attorney, Agent, or Firm* — F. Chau & Associates, LLC (57) ABSTRACT

A semiconductor package molding system includes a press unit, a loading apparatus for loading the first member and the first resin member on the first press apparatus and the second member and the second resin member on the second press apparatus, an unloading apparatus which is adapted to unload a molded first mold from the first press apparatus and a molded second mold from the second press apparatus, and a control unit which is adapted to apply a control signal to the press unit, the loading apparatus, and the unloading apparatus. The press unit includes at least one first press apparatus which is adapted to press a first resin member against a first member to mold a first mold, and at least one second press apparatus which is adapted to press a second resin member against a second member to mold a second mold.

20 Claims, 9 Drawing Sheets

SEMICONDUCTOR PACKAGE MOLDING SYSTEM AND MOLDING METHOD THEREOF

CROSS-REFERENCE TO RELATED APPLICATIONS

This application claims priority to Korean Patent Application No. 10-2010-0108404, filed on Nov. 2, 2010, the disclosure of which is hereby incorporated by reference herein in its entirety.

BACKGROUND

The present disclosure relates to a semiconductor package molding system and a molding method thereof, and more particularly, to a semiconductor package molding system capable of molding different types of molds using a single semiconductor packaging assembly equipment so that efficiency of an equipment may be increased, and a molding method thereof.

For example, semiconductor packages may be completed through a series of processes of die bonding a semiconductor chip onto a surface of a member such as a lead frame or a printed circuit board (PCB), electrically connecting a lead of a lead frame or a pad of a PCB to the semiconductor chip, and covering the semiconductor chip with a resin material forming a seal.

SUMMARY

Exemplary embodiments of the present inventive concept may provide a semiconductor package molding system capable of receiving the same or a different type of a member and a different type of a resin member, processing the received member and resin member into a different type of a mold, and selectively outputting the processed molds, using a single semiconductor packaging assembly equipment, and a molding method thereof.

In accordance with an exemplary embodiment of the present inventive concept, there is provided a semiconductor package molding system including a press unit, a loading apparatus adapted to load the first member and the first resin member on the first press apparatus and the second member and the second resin member on the second press apparatus, an unloading apparatus which is adapted to unload a molded first mold from the first press apparatus and a molded second mold from the second press apparatus, and a control unit which is adapted to apply a control signal to the press unit, the loading apparatus, and the unloading apparatus. The press unit includes at least one first press apparatus which is adapted to press a first resin member against a first member to mold a first mold, and at least one second press apparatus which is adapted to press a second resin member against a second member to mold a second mold.

The second resin member alignment apparatus may include a second resin member container which is adapted to temporarily store a plurality of second resin members that are input, in which a second resin member input hole is formed in an upper surface thereof and a second resin member output hole is formed in a lower surface thereof, a second resin member aligner which is adapted to align the second resin member output through the second resin member output hole to a linear line using a vibrator for vibrating the second resin member in one direction, a second resin member stage in which at least one second resin member groove for accommodating the second resin member is formed, a second resin member individual transfer unit which is adapted to individually transfer the second resin member aligned to the linear line to the second resin member stage, and a second resin member stage transferring unit which is adapted to transfer the second resin member stage to the second resin member standby position.

The member alignment apparatus may include a member magazine loading room which includes a first member magazine input layer which is adapted to transfer a first member magazine to a first elevation standby position, a second member magazine input layer which is adapted to transfer a second member magazine to a second elevation standby position, a first member magazine output layer which is adapted to transfer an empty first member magazine to an empty magazine output position, a second member magazine output layer which is adapted to transfer an empty second member magazine to an empty magazine output position, a magazine holder which is adapted to grip the first member magazine and the second member magazine, and a magazine elevation unit which is adapted to sequentially elevate the magazine holder, a member individual transfer unit which include a member pusher installed at an escape height for the first member and the second member respectively loaded in the first member magazine and the second member magazine which is adapted to be individually transferred by passing through a member path formed in a wall surface of the member magazine loading room, and a pusher actuator which is adapted to move the member pusher back and forth, a member guide adapted to guide the first member and the second member having passed through the member path, and a member rotation stage which is adapted to rotate the first member or the second member to reverse a direction of the first or second member, and in which the member rotation stage includes a member groove where the first member or the second member guided by the member guide is accommodated therein.

The loader may include a loading head which includes a member holder which is adapted to grip the first member or the second member, and a resin holder which is adapted to grip the first resin member or the second resin member, and a loading robot which is adapted to selectively move the loading head in X-axis, Y-axis, and Z-axis directions.

The unloading apparatus may include an unloader which is adapted to pick up a molded first mold from the first press apparatus, transfer the first mold to an accommodation position, pick up a molded second mold from the second press apparatus and transfer the second mold to the accommodation position, a degater which includes a degating stage installed at the accommodation position which is adapted to transfer a transferred first mold or second mold to a degating position, and a degating press installed at the degating position which is adapted to press and cut a gate portion of the transferred first mold or second mold, and a mold alignment apparatus which is adapted to selectively align the first mold or the second mold cut at the degater to a first mold magazine and a second mold magazine.

The unloader may include an unloading head including a mold holder which is adapted to grip the first mold or the second mold, and an unloading robot which is adapted to selectively move the unloading head in X-axis, Y-axis, and Z-axis directions.

The mold alignment apparatus may include a pickup unit which is adapted to individually transfer the first mold or the second mold cut at the degater to a drawing position, a mold individual transfer unit which includes a mold pusher installed at the drawing position which is adapted to individually transfer the first mold or the second mold located at the drawing position, and a pusher actuator which is adapted to move the mold pusher back and forth, and a mold magazine loading room which includes an empty mold magazine input layer which is adapted to transfer an empty first mold magazine and an empty second mold magazine to an empty magazine standby position, a magazine holder which is adapted to grip the empty first mold magazine and the empty second mold magazine, a magazine elevation unit which is adapted to sequentially elevate the magazine holder, a first mold output layer adapted to transfer the first mold magazine to a first mold magazine output position, and a second mold output layer adapted to transfer the second mold magazine to a second mold magazine output position.

In accordance with an exemplary embodiment of the inventive concept, there is provided a semiconductor package molding system including a press unit which includes at least one first press apparatus which is adapted to press a first resin member against a first member to mold a first mold, and at least one second press apparatus adapted to press a second resin member against a second member to mold a second mold, a first resin member alignment apparatus which is adapted to align the first resin member, a second resin member alignment apparatus which is adapted to align the second resin member, a member alignment apparatus adapted to align the first member and the second member, a loader which is adapted to pick up the first member and the first resin member, transfer the first member and the first resin member to the first press apparatus, pick up the second member and the second resin member and transfer the second member and the second resin member to the second press apparatus, an unloader adapted to pick up a first mold molded at the first press apparatus and pick up a second mold molded at the second press apparatus, a degater adapted to receive the first mold and the second mold from the unloader and press and cut a gate portion of the transferred first mold or second mold, and a mold alignment apparatus adapted to selectively align the first mold or second mold cut at the degater to a first mold magazine and a second mold magazine.

In accordance with an exemplary embodiment of the present invention, a method of molding in a package molding system is provided. The method includes performing a primary alignment of a first member and a first resin member using a first member alignment apparatus and a first resin member alignment apparatus, picking up the aligned first member and first resin member and loading the first member and first resin member in a first press apparatus using a loader, performing a process in which the first press apparatus melts, presses and molds the first resin member with respect to the first member to form a first mold, aligning a second member and a second resin member using a second resin member alignment apparatus and the member alignment apparatus, while the first mold is being formed in the first press apparatus, picking up the aligned second member and second resin member and loading the second member and the second resin member in a second press apparatus using the loader, and performing a process in which the second press apparatus melts, presses and molds the second resin member with respect to the second member to form a second mold. The method further includes unloading the first mold to a degater using an unloader, while the second mold is being formed in the second press apparatus, performing an operation in which the degater cuts a gate portion of the first mold, loading the first mold with the gate portion that has been cut on a first mold magazine using a mold alignment apparatus, unloading the second mold on the degater, performing an operation in which the degater cuts a gate portion of the second mold and loading the second mold with the gate portion that has been cut into a second mold magazine using the mold alignment apparatus.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF EXEMPLARY EMBODIMENTS

Exemplary embodiments of the present inventive concept are described herein. However, exemplary embodiments of the present inventive concept are not limited thereto and it will be understood that various changes in form and details may be made therein without departing from the spirit and scope of the following claims. That is, descriptions on particular structures or functions may be presented merely for explaining exemplary embodiments of the present inventive concept.

In the following description, when a layer is described to exist on another layer, the layer may exist directly on the other layer or an intervening layer may be interposed therebetween. Also, the thickness or size of each layer illustrated in the drawings are exaggerated for convenience of explanation and clarity. Like references indicate like constituent elements in the drawings. As used in the present specification, the term "and/or" includes any one of listed items and all of at least one combination of the items.

Figure 1:
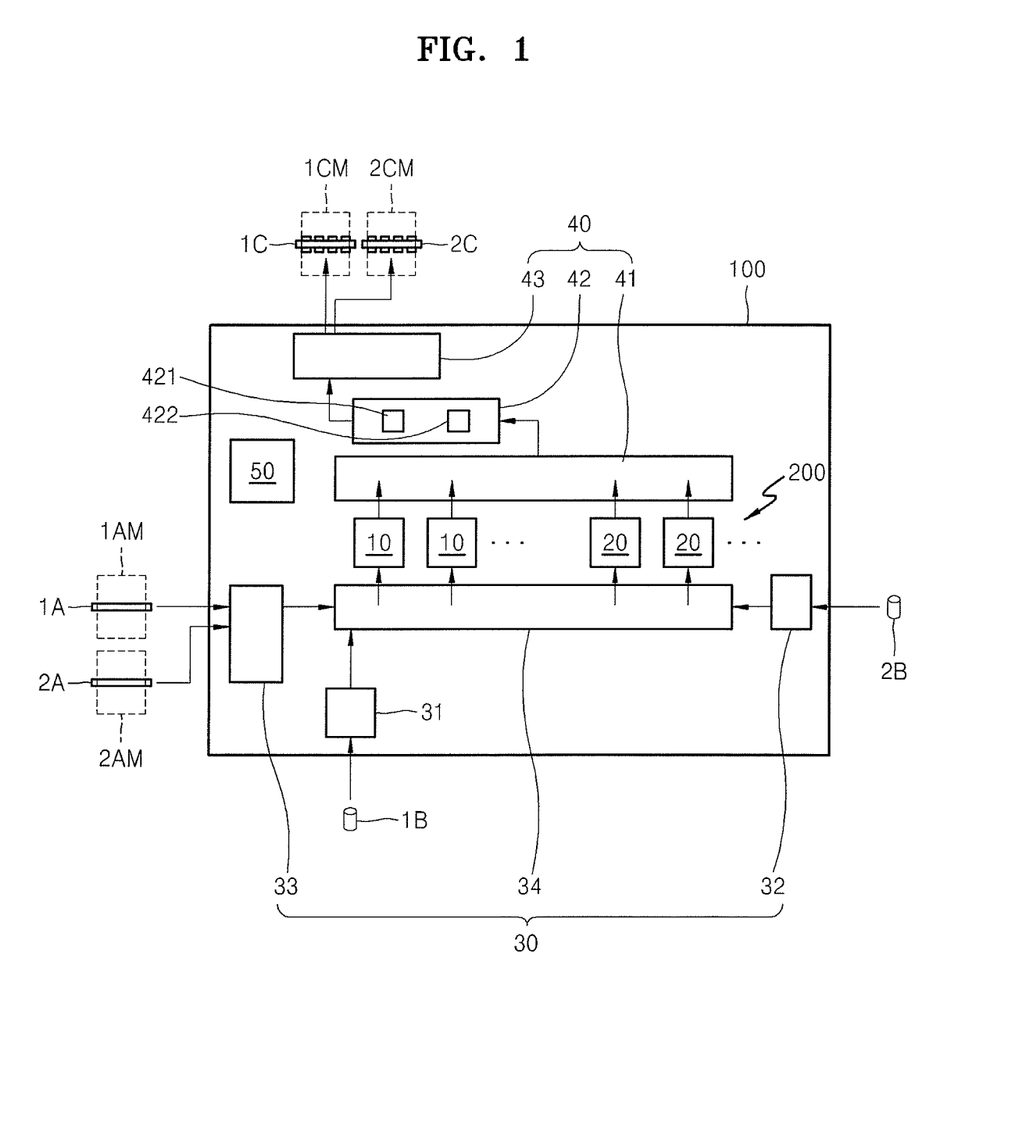
FIG. 1 is a conceptual diagram of a semiconductor package molding system according to an exemplary embodiment of the present inventive concept.

FIG. 1 is a conceptual diagram of a semiconductor package molding system according to an exemplary embodiment of the present inventive concept. Referring to FIG. 1, the semiconductor package molding system according to an exemplary embodiment of the present inventive concept includes, for example, a press unit 200 for molding different types of molds 1C and 2C, a loading apparatus 30 for loading different types of members 1A and 2A and different types of resin members 1B and 2B on the press unit 200, an unloading apparatus 40 for unloading the molded molds 1C and 2C from the press unit 200, and a control unit 50 for controlling the above constituent elements.

The first and second members 1A and 2A may have the same outside specification, that is, the same outside size. In addition, for example, a lead frame or a printed circuit board (PCB) of a different type, material, or outside specification may be employed. Also, the first and second resin members 1B and 2B may be formed of, for example, different materials.

The first and second members 1A and 2A and the first and second resin members 1B and 2B may be diversely configured according to the request of a customer. For example, when the finally requested strength of a mold is high, an epoxy molding compound (EMC) exhibiting a high strength property may be employed. In addition, for example, when the shape of a mold is complicated, a semiconductor chip and wires are densely arranged in a mold, or the thickness of a mold is very thin, an EMC exhibiting a superior fluidity property during melting may be employed.

Thus, during production of various types of molds according to the request of a customer, in the semiconductor package molding system according to an exemplary embodiment of the present inventive concept, when the first and second members 1A and 2A and the first and second resin members 1B and 2B are input, the press unit 200 may process the input first and second members 1A and 2A and first and second resin members 1B and 2B into the first and second molds 1C and 2C, and selectively output the processed first and second molds 1C and 2C to magazines.

Figure 2:
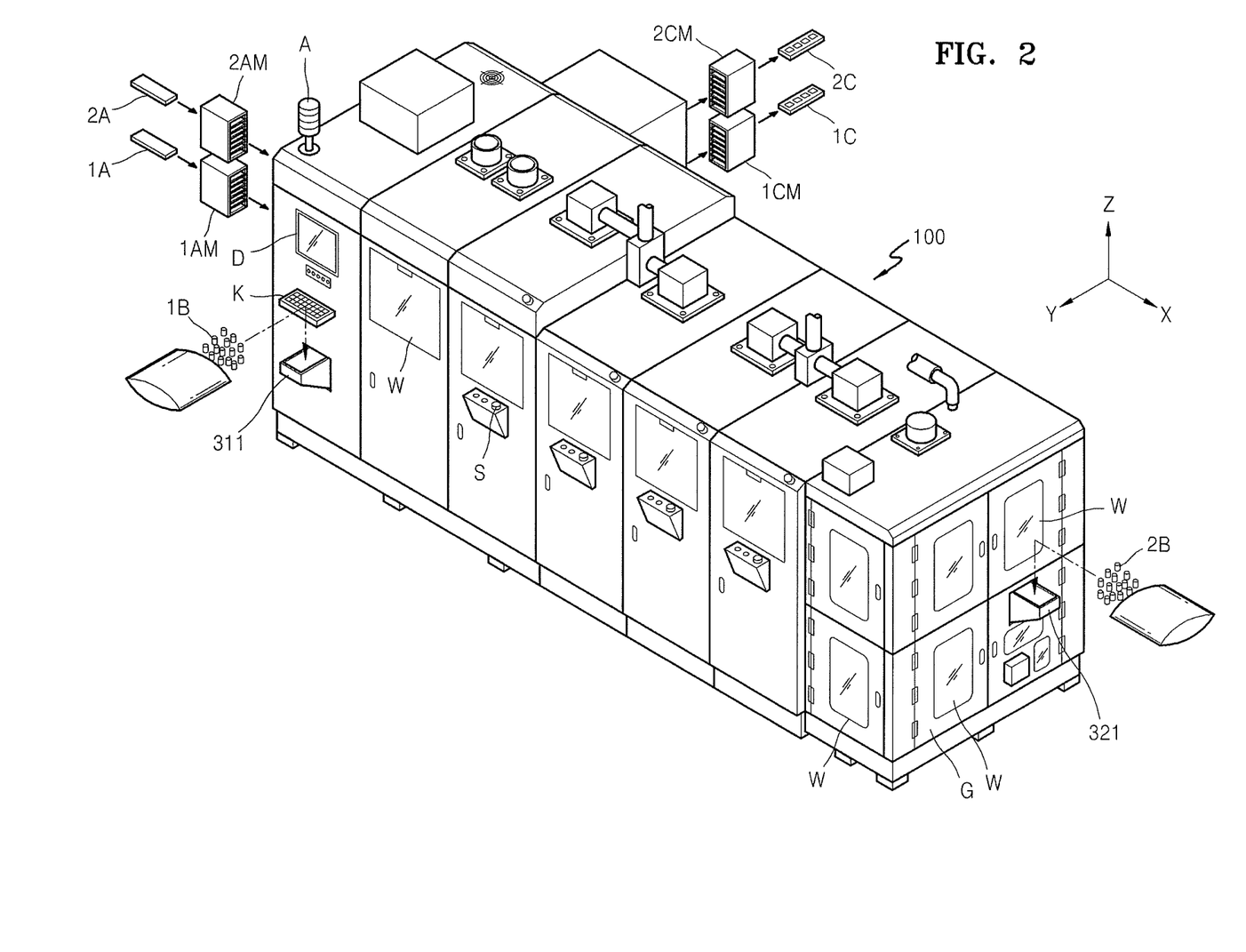
FIG. 2 is a perspective view of a semiconductor package molding system according to an exemplary embodiment of the present inventive concept.
Figure 3:
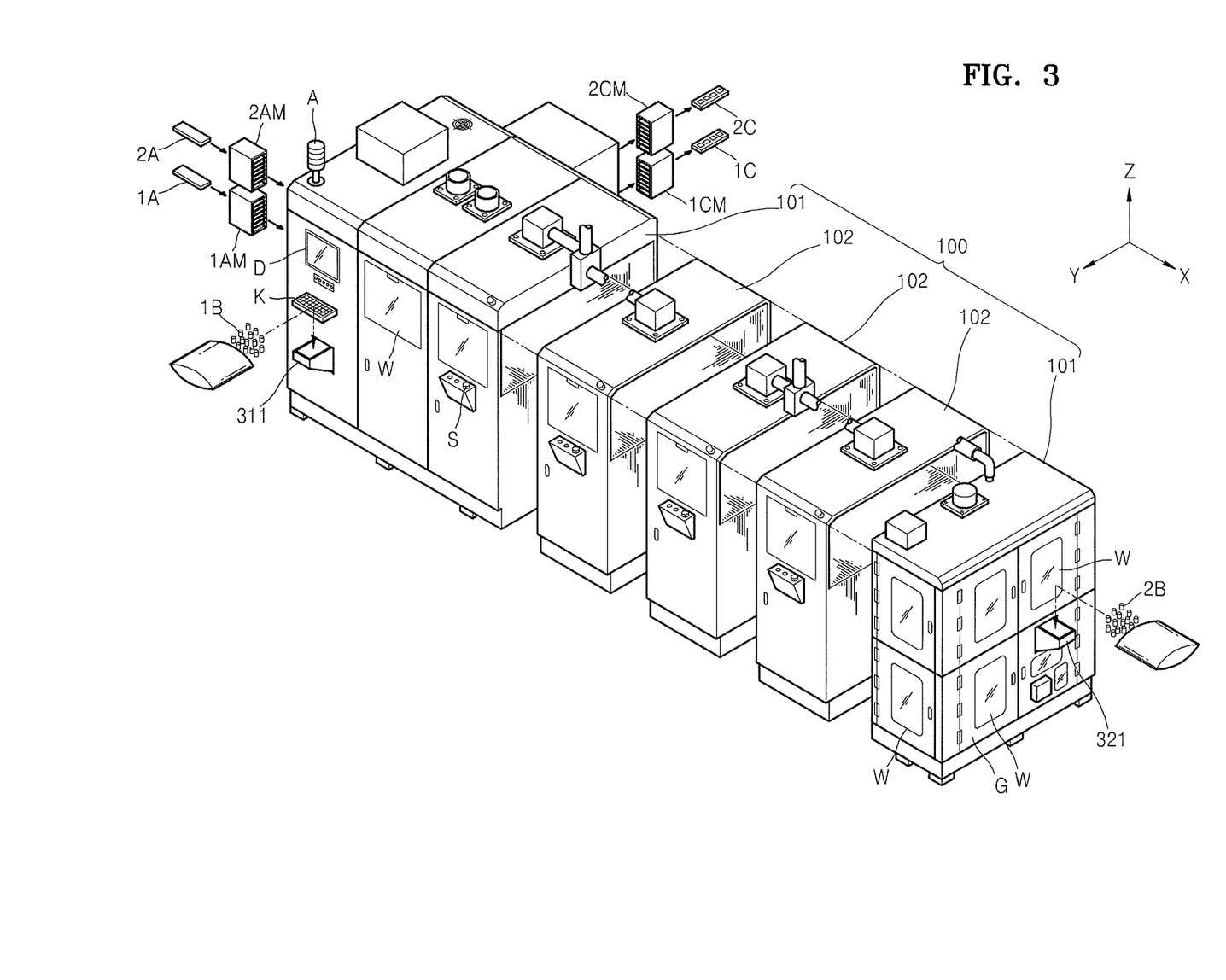
FIG. 3 is a perspective view of the semiconductor package molding system of FIG. 2 in which a case is separated.
Figure 4:
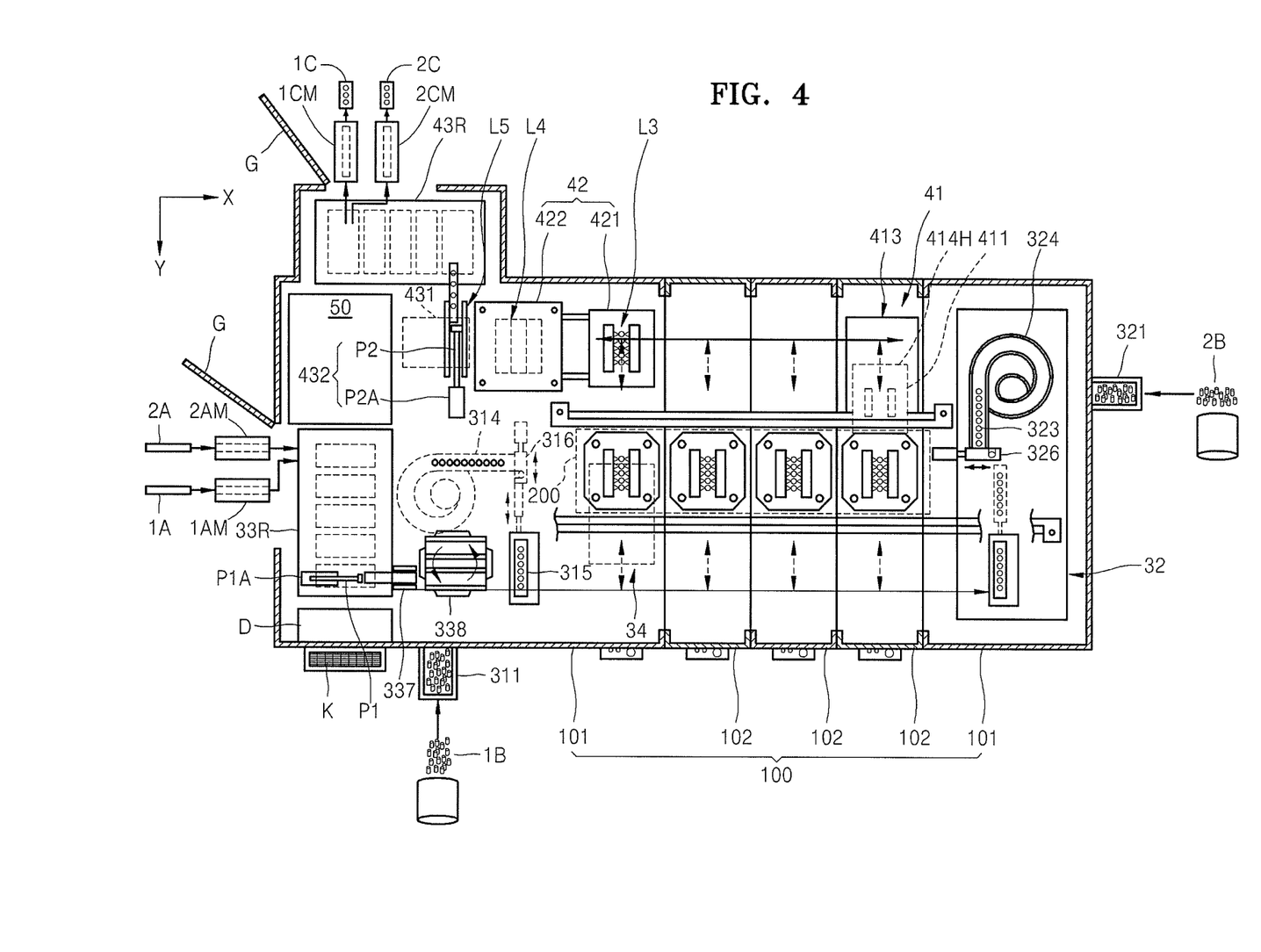
FIG. 4 is a horizontal cross-sectional view of the semiconductor package molding system of FIG. 2.
Figure 5:
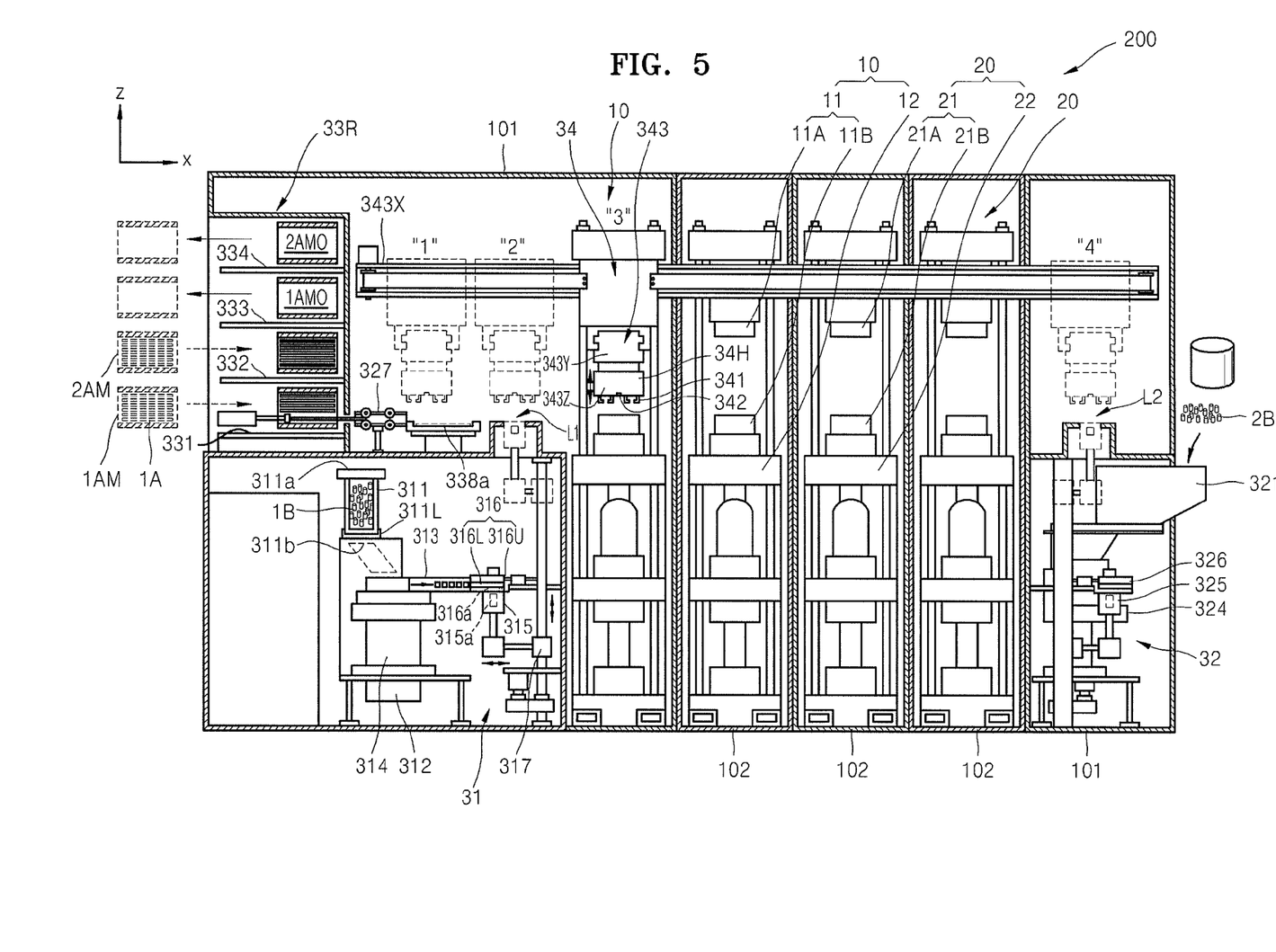
FIG. 5 is a vertical cross-sectional view of the semiconductor package molding system of FIG. 2.
Figure 6:
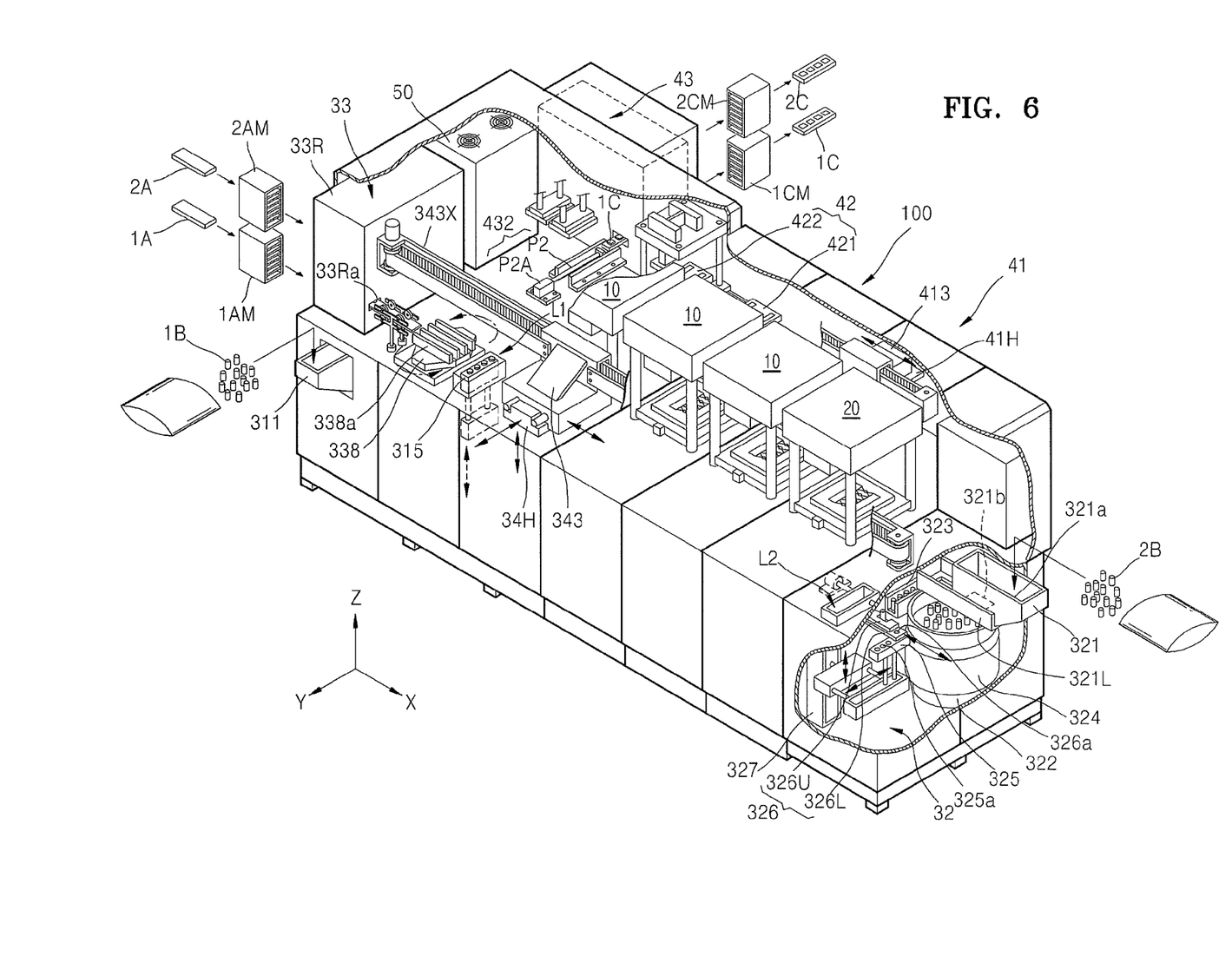
FIG. 6 is a partially cut-away perspective view of the semiconductor package molding system of FIG. 2.

FIG. 2 is a perspective view of a semiconductor package molding system according to an exemplary embodiment of the present inventive concept. FIG. 3 is a perspective view of the semiconductor package molding system of FIG. 2 in which a case is separated. FIG. 4 is a horizontal cross-sectional view of the semiconductor package molding system of FIG. 2. FIG. 5 is a vertical cross-sectional view of the semiconductor package molding system of FIG. 2. FIG. 6 is a partially cut-away perspective view of the semiconductor package molding system of FIG. 2.

As it is illustrated in FIGS. 1, 4, and 5, the press unit 200 may include, for example, a first press apparatus 10 and a second press apparatus 20. That is, the first press apparatus 10 molds the first mold 1C by pressing the first resin member 1B against the first member 1A at a high temperature. At least one first press apparatus 10 may be installed.

The number of the first press apparatus 10 and the second press apparatus 20 to be installed may be freely configured. As illustrated in FIGS. 2-6, for easy explanation of the technical concept of an exemplary embodiment of the present inventive concept, a semiconductor package molding system includes, for example, two units of the first press apparatus 10 and two units of the second press apparatus 20 which are arranged in series.

Also, as illustrated in FIG. 5, the first press apparatus 10 includes, for example, a molding unit 11 and a press 12. The molding unit 11 includes, for example, an upper plate 11A and a lower plate 11B which are coupled together to injection mold the first member 1A by melting the first resin member 1B at a high temperature and a high pressure. Also, the press 12 presses the upper plate 11A and the lower plate 11B in a vertical direction so as to be coupled to each other.

The second press apparatus 20 includes, for example, a molding unit 21 and a press 22. The molding unit 21 includes, for example, an upper plate 21A and a lower plate 21B which are coupled together to injection mold the second member 2A by melting the second resin member 2B at a high temperature and a high pressure. Also, the press 22 presses the upper plate 21A and the lower plate 21B in a vertical direction so as to be coupled to each other.

The first press apparatus 10 may be used as the second press apparatus 20 by simply replacing the upper and lower plates 11A and 11B of the first press apparatus 10 with the upper and lower plates 21A and 21B of the second press apparatus 20. Conversely, the second press apparatus 20 may be used as the first press apparatus 10 by simply replacing the upper and lower plates 21A and 21B of the second press apparatus 20 with the upper and lower plates 11A and 11B of the first press apparatus 10.

Thus, during the production of various types of molds, the number of the first and second press apparatuses 10 and 20 to be installed may be freely set according to a situation so that productivity may be increased.

As illustrated in FIGS. 1 and 2, in the semiconductor package molding system according to an exemplary embodiment of the present exemplary embodiment, the first press apparatus 10, the second press apparatus 20, the loading apparatus 30, and the unloading apparatus 40 may be protected by being housed by a case 100. Also, as illustrated in FIG. 3, the case 100 may include, for example, at least one main case 101 housing a part of the loading apparatus 30 and the unloading apparatus 40, and at least one module case 102 detachably coupled to the main case 101 to facilitate additional installation of the first press apparatus 10 or the second press apparatus 20 and housing the first press apparatus 10 or the second press apparatus 20.

A variety of a check window W and a door G for checking the operation states of internal apparatuses with the naked eye may be installed in the case 100.

Thus, the model case 102 in which the first press apparatus 10 or the second press apparatus 20 are installed may be additionally connected to as many other model cases 102 as a user desires. Then, the module case 102 and the main case 101 are connected to each other and assembled into a single case 100.

As illustrated in FIG. 1, the loading apparatus 30 according to the present exemplary embodiment is, for example, a mixed flow type transfer unit which may primarily load the first member 1A and the first resin member 1B in the first press apparatus 10 and secondarily load the second member 2A and the second resin member 2B in the second press apparatus 20.

The loading apparatus 30 may include, for example, a first resin member alignment apparatus 31, a second member alignment apparatus 32, a member alignment apparatus 33, and a loader 34. That is, as illustrated in FIG. 5, the first resin member alignment apparatus 31 for aligning the first resin member 1B to a first resin member standby position L1 may include, for example, a first resin member container 311, a first resin member aligner 314, a first resin member stage 315, a first resin member individual transfer unit 316, and a first resin member stage elevation unit 317.

The first resin member container 311 includes, for example, a first resin member input hole 311a in an upper surface thereof and a first resin member output hole 311b in a lower surface thereof. The first resin member container 311 may be, for example, a hoper having, for example, a funnel shape for temporarily storing a plurality of the first resin members 1B that are input.

The first resin member container 311, as illustrated in FIG. 2, slides along a rail 311L of FIG. 5 outside the case 100 so that the first resin member 1B may be readily input from the outside. Also, the first resin member aligner 314, as illustrated in FIG. 5, may be, for example, a bowl feeder unit for aligning the first resin member 1B that is output through the first resin member output hole 311b to a linear line 313 by using a vibrator 312 for vibrating the first resin member 1B in one direction.

The first resin member stage 315 includes, for example, at least one first resin member groove 315a for accommodating the first resin member 1B. The first resin member individual transfer unit 316 transfers the first resin member 1B aligned to the linear line 313 one by one to the first resin member stage 315. For example, the first resin member individual transfer unit 316 may include a drop rod 316U for individually gripping the first resin member 1B and advancing toward a through hole 316a formed in a lower plate 316L to drop the first resin member 1B having a cylindrical shape through the through hole 316a.

As illustrated in FIG. 5, the first resin member stage elevation unit 317 transfers the first resin member stage 315 to the first resin member standby position L1. The first resin member stage elevation unit 317 may be, for example, a transfer robot that may actuate the first resin member stage 315 to move back and forth, and up and down, by using a variety of actuators such as, for example, a screw rod, a linear motor, or a pneumatic/hydraulic cylinder.

Thus, the first resin member 1B, as illustrated in FIG. 5, is input to the first resin member container 311 and aligned to the linear line 313 by the first resin member aligner 314. Then, the first resin member 1B is accommodated in the first resin member stage 315 by the first resin member individual transfer unit 316, and transferred to the first resin member standby position L1 by the first resin member stage elevation unit 317 and aligned thereto.

Also, as illustrated in FIG. 6, the second resin member alignment apparatus 32 for aligning the second resin member 2B to a second resin member standby position L2 may include, for example, a second resin member container 321, a second resin member aligner 324, a second resin member stage 325, a second resin member individual transfer unit 326, and a second resin member stage elevation unit 327.

The second resin member container 321 includes, for example, a second resin member input hole 321a in an upper surface thereof and a second resin member output hole 321b in a lower surface thereof. The second resin member container 321 may be, for example, a hoper having a funnel shape for temporarily storing a plurality of the second resin members 2B that are input.

The second resin member container 321, as illustrated in FIG. 2, slides along a rail 321L of FIG. 6 outside the case 100 so that the second resin member 2B may be readily input from the outside. Also, the second resin member aligner 324, as illustrated in FIG. 6, may be, for example, a bowl feeder unit for aligning the second resin member 2B to a linear line 323 by using a vibrator 322 for vibrating in one direction the second resin member 2B that is output through the second resin member output hole 321b.

The second resin member stage 325 includes, for example, at least one second resin member groove 325a for accommodating the second resin member 2B. The second resin member individual transfer unit 326 transfers the second resin member 2B aligned to the linear line 323 one by one to the second resin member stage 325. For example, the second resin member individual transfer unit 326 may include a drop rod 326U for individually gripping the second resin member 2B and advancing toward a through hole 326a formed in a lower plate 326L to drop the second resin member 2B having a cylindrical shape through the through hole 326a.

As illustrated in FIG. 6, the second resin member stage elevation unit 327 transfers the second resin member stage 325 to the second resin member standby position L2. For example, the second resin member stage elevation unit 327 may be a transfer robot that may actuate the second resin member stage 325 to move back and forth, and up and down, by using a screw rod or a linear motor.

Thus, the second resin member 2B, as illustrated in FIG. 6, is input to the second resin member container 321 and aligned to the linear line 323 by the second resin member aligner 324. Then, the second resin member 2B is accommodated in the second resin member stage 325 by the second resin member individual transfer unit 326, and transferred to the second resin member standby position L2 by the second resin member stage elevation unit 327 and aligned thereto.

Figure 7:
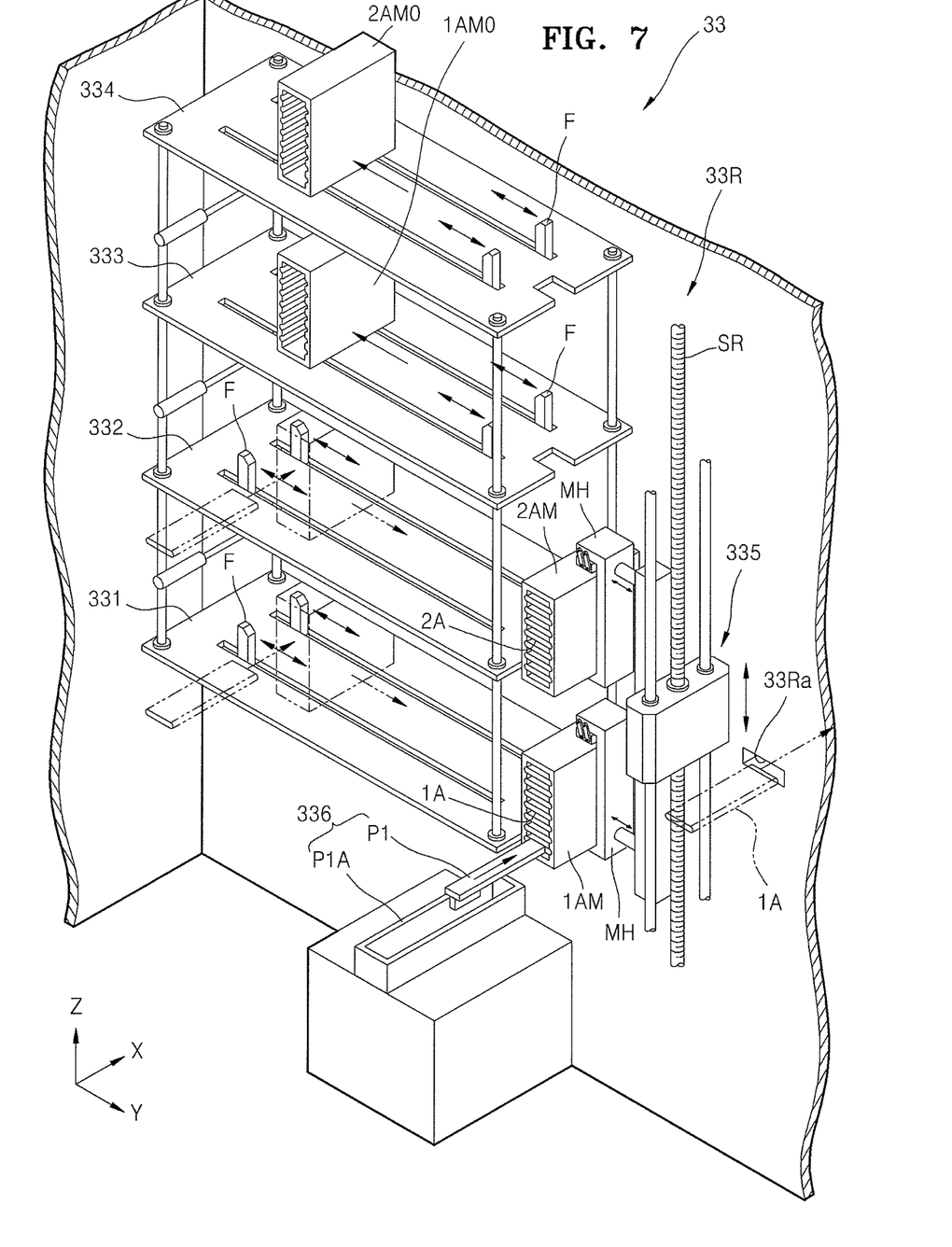
FIG. 7 is a partially cut-away perspective view illustrating a member aligning apparatus of FIG. 6.

FIG. 7 is a partially cut-away perspective view illustrating the member aligning apparatus 33 of FIG. 6. Referring to FIG. 4-7, the member alignment apparatus 33 sequentially aligns the first and second members 1A and 1B to the first and second resin member standby positions L1 and L2, and may include, for example, a member magazine loading room 33R, an individual member transfer unit 336, a member guide 337, and a member rotation stage 338.

As illustrated in FIG. 7, the member magazine loading room 33R may include, for example, a first member magazine input layer 331, a second member magazine input layer 332, a first member magazine output layer 333, a second member magazine output layer 334, a magazine holder MH, and a magazine elevation unit 335.

That is, the first member magazine input layer 331 transfers a first member magazine 1AM, in which at least one first member 1A is loaded at an interval, to a first elevation standby position by a magazine transfer finger F. The second member magazine input layer 332 transfers a second member magazine 2AM, in which at least one second member 2A is loaded at an interval, to a second elevation standby position by the magazine transfer finger F.

The first member magazine output layer 333 transfers an empty first member magazine 1AM0 to an empty magazine output position by the magazine transfer finger F. The second member magazine output layer 334 transfers an empty second member magazine 2AM0 to the empty magazine output position by the magazine transfer finger F.

The magazine holder MH grips the first member magazine 1AM at the first elevation standby position and the second member magazine 2AM at the second elevation standby position. The magazine elevation unit 335 sequentially elevates the first and second member magazines 1AM and 2AM gripped by the magazine holder MH until the first and second members 1A and 2A respectively loaded in the first and second member magazines 1AM and 2AM arrive at an escape height.

Although, in FIG. 7, a screw rod SR is used as the magazine elevation unit 335, a transfer robot capable of elevating the magazine holder MH using a variety of actuators such as, for example, a linear motor or a pneumatic/hydraulic cylinder may be used therefor.

As illustrated in FIG. 7, the individual member transfer unit 336 may include, for example, a member pusher P1 installed at the escape height and a pusher actuator P1A moving the member pusher P1 back and forth, to individually transfer the first and second members 1A and 2A respectively loaded in the first and second member magazines 1AM and 2AM through a member path 33Ra formed in a wall surface of the member magazine loading room 33R.

Thus, as illustrated in FIG. 7, the first member magazine 1AM loaded with the first member 1A is input and transferred to the first member magazine input layer 331, and the second member magazine 2AM loaded with the second member 2A is input and transferred to the second member magazine input layer 332. Then, the first and second member magazines 1AM and 2AM are gripped by the magazine holder MH and sequentially elevated along the magazine elevation unit 335. Thus, the first and second members 1A and 2A may be individually transferred through the member path 33Ra formed in the wall surface of the member magazine loading room 33R by the member pusher P1 of the individual member transfer unit 336.

Also, as illustrated in FIG. 6, the member guide 337 may be, for example, a conveyer for guiding the first and second members 1A and 2A which have passed through the member path 33Ra. Also, the member rotation stage 338 may be, for example, a turntable rotated to reverse the direction of the first or second member 1A or 2A. A member groove 338a in which the first or second member 1A or 2A guided by the member guide 337 is accommodated is formed in the member rotation stage 338.

Thus, as illustrated in FIG. 6, the first or second member 1A or 2A that is individually transferred by passing through the member path 33Ra may be transferred along the member guide 337 and symmetrically accommodated in the member groove 338a of the member rotation stage 338 that reciprocally rotates.

As illustrated in FIGS. 5 and 6, the loader 34 primarily picks up the first member 1A that is aligned to the member standby position, that is, accommodated in the member groove 338a of the member rotation stage 338, and the first resin member 1B aligned to the first resin member standby position L1. In addition, the loader 34 transfers the first member 1A and the first resin member 1B to the first press apparatus 10, and secondarily picks up the second member 2A that is aligned to the member standby position and the second resin member 2B aligned to the second resin member standby position L2, and transfers the second member 2A and the second resin member 2B to the second press apparatus 20.

As illustrated in FIG. 5, the loader 34 may include, for example, a loading head 34H and a loading robot 343. The loading head 34H may include, for example, a member holder 341 for gripping the first member 1A aligned in the member groove 338a at a position "1" of FIG. 5 and a resin holder 342 for gripping the first resin member 1B at a position "2" of FIG. 5 or the second resin member 2B at a position "4" of FIG. 5.

The loading robot 343 is, for example, a transfer unit for selectively moving the loading head 34H in directions along an X-axis, a Y-axis, and a Z-axis. Although a variety of transfer unites having diverse shapes may be employed, as illustrated in FIG. 5, a movement in the X-axis uses a transfer rail 343X installed in the X-axis direction, a movement in the Y-axis uses a Y-axis mobile block 343Y capable of moving in the Y-axis direction, and a movement in the Z-axis uses a Z-axis mobile block 343Z capable of moving in the Z-axis direction.

Thus, as illustrated in FIG. 5, when the first mold 1C is molded, the loading head 34H grips the first member 1A aligned in the member groove 338a at the position "1" of FIG. 5 and the first resin member 1B at the position "2" of FIG. 5, and loads the gripped first member 1A and first resin member 1B on the first press apparatus 10. While the first mold 1C is molded in the first press apparatus 10, to mold the second mold 2C, the loading head 34H grips the second member 2A aligned in the member groove 338a at the position "1" of FIG. 5 and the second resin member 2B at the position "4" of FIG. 5 and then loads the gripped second member 2A and second resin member 2B on the second press apparatus 20.

The unloading apparatus 40 is, for example, a mixed flow type transfer unit for unloading the first mold 1C molded by the first press apparatus 10 and the second mold 2C molded by the second press apparatus 20. As illustrated in FIGS. 4 and 6, the unloading apparatus 40 may include, for example, an unloader 41, a degater 42, and a mold alignment apparatus 43.

The unloader 41 primarily picks up the first mold 1C molded by the first press apparatus 10 and transfers the first mold 1C to an accommodation position, and secondarily picks up the second mold 2C molded by the second press apparatus 20 and transfers the second mold 2C to an accommodation position.

That is, the unloader 41 may include, for example, an unloading head 41H having a mold holder 411 for gripping the first mold 1C or the second mold 2C and an unloading robot 413 for selectively moving the unloading head 41H in the X-axis, Y-axis, and Z-axis directions. The unloading robot 413 is, for example, a transfer unit for selectively moving the unloading head 41H in the X-axis, Y-axis, and Z-axis directions. The unloading robot 413 may be a variety of transfer units having diverse shapes.

Thus, as illustrated in FIG. 4, when the molding work of the first mold 1C is completed, the unloading head 41H grips the first mold 1C molded in the first press apparatus 10, transfers the first mold 1C to the degater 42, and unloads the first mold 1C. When the molding work of the second mold 2C is completed, the unloading head 41H grips the second mold 2C molded in the second press apparatus 20, transfers the second mold 2C to the degater 42, and unloads the second mold 1C.

The degater 42, as illustrated in FIGS. 4 and 6, may include, for example, a degating stage 421 and a degating press 422. The degating stage 421 is a transfer stage that is installed at an accommodation position L3 of FIG. 4 to transfer the transferred first or second mold 1C or 2C to a degating position L4. Also, the degating press 422 is a press that is installed at the degating position L4 to press and cut a gate portion (not shown) of the transferred first or second mold 1C or 2C.

Thus, as illustrated in FIG. 4, the first or second mold 1C or 2C unloaded at the accommodation position L3 of FIG. 4 by the unloading head 41H is transferred to the degating position L4 by the degating stage 421 so that a degating process of pressing and cutting the gate portion using the degating press 422 may be performed.

As illustrated in FIGS. 4 and 6, the mold alignment apparatus 43 selectively aligns the first and second molds 1C and 2C cut at the degater 42 respectively in the first and second mold magazines 1CM and 2CM. The mold alignment apparatus 43 may include, for example, a pickup unit 431, a mold individual transfer unit 432, and a mold magazine loading room 43R.

As illustrated in FIG. 4, the pickup unit 431 individually transfers the first or second mold 1C or 2C cut at the degater 42 to a drawing position L5 of FIG. 4. The pickup unit 431 is capable of being rotated to constantly reverse the direction of the degated first or second mold 1C or 2C.

As illustrated in FIGS. 4 and 6, the mold individual transfer unit 432 may include, for example, a mold pusher P2 installed at the drawing position for individually transferring the first or second mold 1C or 2C located at the drawing position L5 of FIG. 4 and a pusher actuator P2A for moving the mold pusher P2 back and forth. Thus, the first or second mold 1C or 2C that has completed the degating process may be individually transferred to the drawing position L5 of FIG. 4 by the pickup unit 431.

Figure 8:
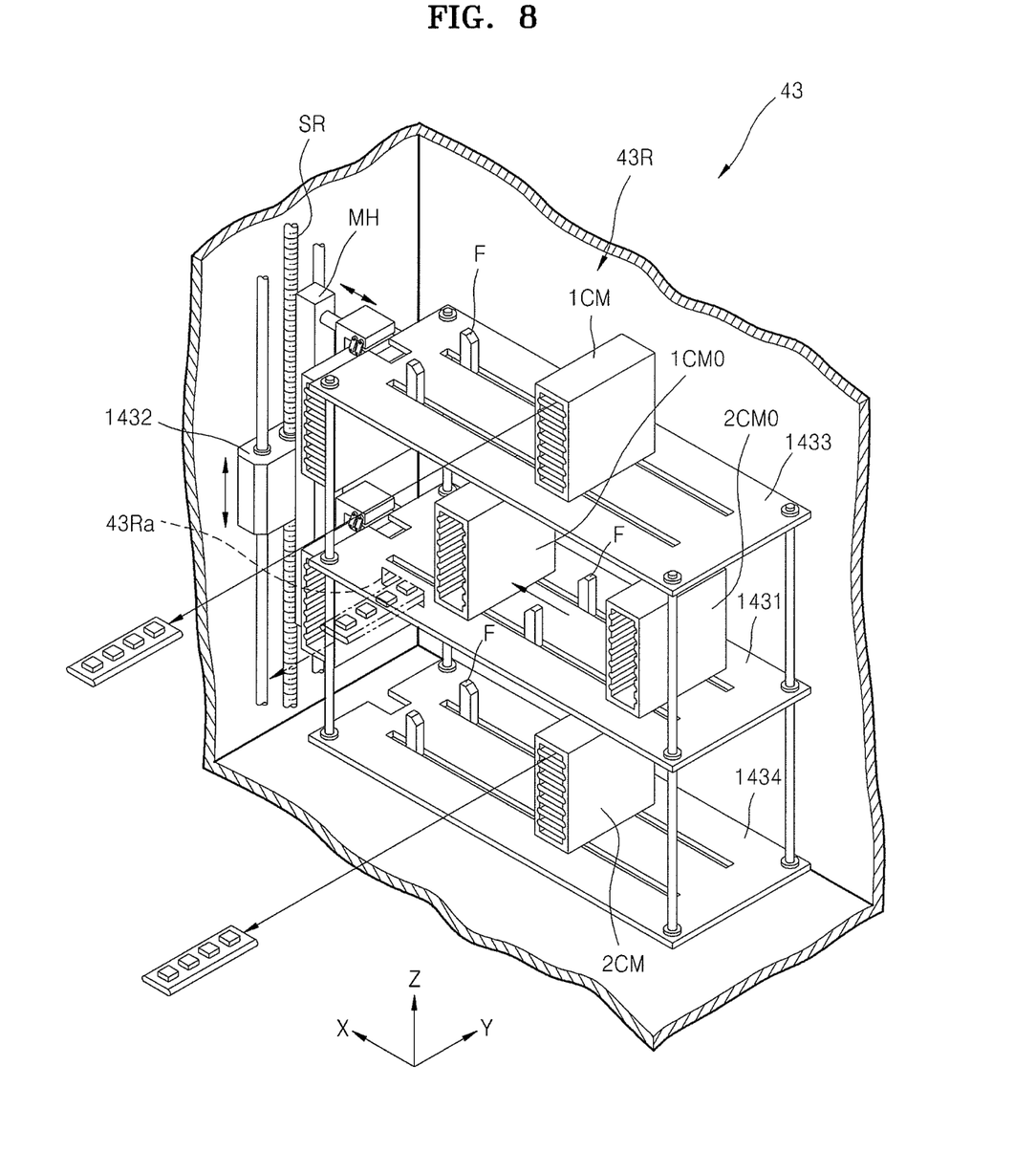
FIG. 8 is a partially cut-away perspective view illustrating a mold alignment apparatus of FIG. 6.

FIG. 8 is a partially cut-away perspective view illustrating the mold alignment apparatus 43 of FIG. 6. As illustrated in FIG. 8, the mold magazine loading room 43R of the mold alignment apparatus 43 may include, for example, an empty mold magazine input layer 1431, a magazine holder MH, a magazine elevation unit 1432, a first mold output layer 1433, and a second mold output layer 1434.

That is, the empty mold magazine input layer 1431 is a layer to transfer an empty first mold magazine 1CM0 and an empty second mold magazine 2CM0 to an empty magazine standby position using a transfer finger F. Also, the magazine holder MH grips the empty first mold magazine 1CM0 and the empty second mold magazine 2CM0 at the empty magazine standby position.

The magazine elevation unit 1432 sequentially stacks the first mold 1C and the second mold 2C respectively in the first mold magazine 1CM and the second mold magazine 2CM, by sequentially elevating the magazine holder MH, and the first and second molds 1C and 2C which have passed through a mold path 43Ra formed in a wall surface and which are being individually transferred by the mold pusher P2 are sequentially and respectively stacked in the first mold magazine 1CM and the second mold magazine 2CM.

Although the magazine elevation unit 1432 employs the screw rod SR as illustrated in FIG. 8, a transfer robot that may elevate the magazine holder MH by using a variety of actuators such as, for example, a linear motor or a pneumatic/hydraulic cylinder may be used therefor.

The first mold output layer 1433 is a layer for transferring the first mold magazine 1CM in which the first mold 1C is stacked, to a first mold magazine output position, by using the magazine transfer finger F. The second mold output layer 1434 is a layer for transferring the second mold magazine 2CM in which the second mold 2C is stacked, to a second mold magazine output position, by using the magazine transfer finger F.

Thus, as illustrated in FIG. 8, when the empty first mold magazine 1CM0 and the empty second mold magazine 2CM0 are input to the empty mold magazine input layer 1431, the first and second mold magazines 1CM0 and 2CM0 are transferred to the empty magazine standby position by the transfer finger F. The empty first and second mold magazines 1CM0 and 2CM0 are gripped by the magazine holder MH and sequentially elevated by the magazine elevation unit 1432. In doing so, the first mold 1C and the second mold 2C, which have passed through the mold path 43Ra formed in the wall surface and are individually transferred by the mold pusher P2, are sequentially and respectively stacked in the first mold magazine 1CM and the second mold magazine 2CM.

The empty first and second mold magazines 1CM and 2CM are elevated by the magazine elevation unit 1432 and transferred respectively to the first and second mold output layers 1433 and 1434. The first mold magazine 1CM in which the first mold 1C is stacked is selectively output to the outside from the first mold output layer 1433. The second mold magazine 2CM in which the second mold 2C is stacked is selectively output to the outside from the second mold output layer 1434.

As illustrated in FIGS. 1, 4, and 6, the control unit 50 is a controller to sequentially apply a control signal to the press unit 200, the loading apparatus 30, and the unloading apparatus 40 according to a series of previously input programs. The control unit 50 receives a first resin member alignment signal from the first resin member alignment apparatus 31 and a first member alignment signal from the member alignment apparatus 33 to check the alignments of the first resin member 1B and the first member 1A, and outputs a first member/first resin member pickup command signal and a first press apparatus loading command signal to the loader 34. Also, the control unit 50 receives a second resin member alignment signal from the second resin member alignment apparatus 32 and a second member alignment signal from the member alignment apparatus 33 to check the alignments of the second resin member 2B and the second member 2A, and outputs a second member/second resin member pickup command signal and a second press apparatus loading command signal to the loader 34. Thus, a loading work may be performed.

Also, the control unit 50 outputs a first mold unloading command signal to the unloader 41 so that the first mold 1C may be unloaded from the first press apparatus 10 in which a molding process is completed, and a second mold unloading command signal to the unloader 41 so that the second mold 2C may be unloaded from the second press apparatus 20 in which the molding process is completed. Thus, an unloading work may be performed.

In addition, as illustrated in FIG. 2, the control unit 50 may further include, for example, a keyboard K that is a command input device, a display device D, a warning apparatus A, and various switches S.

Figure 9:
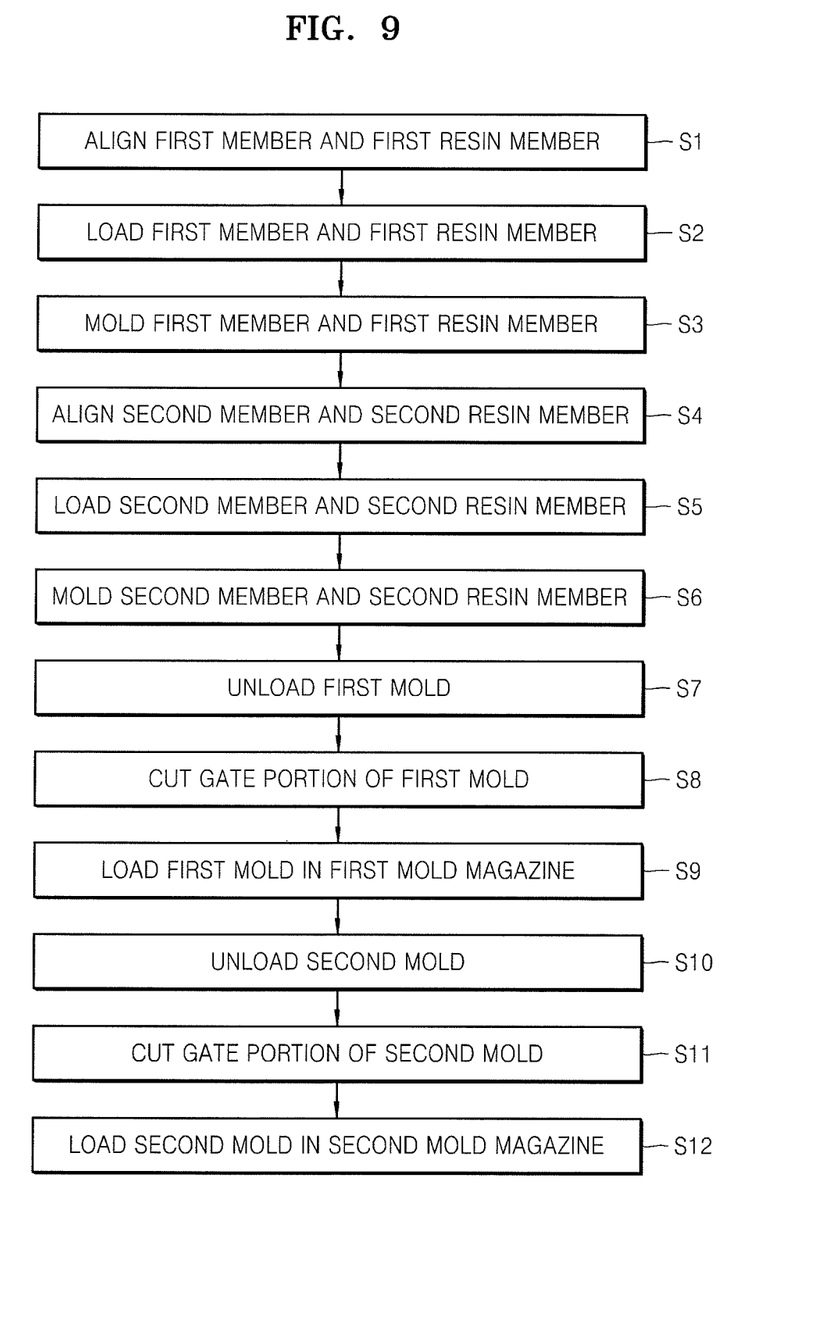
FIG. 9 is a flowchart for explaining a method of molding in a semiconductor package molding system according to an exemplary embodiment of the present inventive concept.

FIG. 9 is a flowchart for explaining a method of molding in a semiconductor package molding system according to an exemplary embodiment of the present inventive concept. Referring to FIG. 9, in the semiconductor package molding system according to an exemplary embodiment of the present inventive concept, the first resin member alignment apparatus 31 and the member alignment apparatus 33 may perform an operation S1 of primarily aligning the first member 1A and the first resin member 1B.

As illustrated in FIG. 5, when the first resin member 1B is input to the first resin member container 311 and aligned to the linear line 313 by the first resin member aligner 314, the first resin member 1B is accommodated in the first resin member stage 315 by the first resin member individual transfer unit 316. Then, the first resin member 1B is transferred to the first resin member standby position L1 by the first resin member stage elevation unit 317 and aligned thereto.

Also, as illustrated in FIG. 7, the first member magazine 1AM loaded with the first member 1A is input to the first member magazine input layer 331 and transferred thereon. The first member magazine 1AM gripped by the magazine holder MH is sequentially elevated along the magazine elevation unit 335. The first member 1A is pushed by the member pusher P1 of the member individual transfer unit 336 to be individually transferred by passing through the member path 33Ra formed in the wall surface of the member magazine loading room 33R. As illustrated in FIG. 6, the first member 1A that is individually transferred by passing through the member path 33Ra may be transferred along the member guide 337 and symmetrically accommodated in the member groove 338a of the member rotation stage 338 that repeats reverse.

In the semiconductor package molding system according to the present exemplary embodiment, an operation S2 may be performed in which the loader 34 picks up the aligned first member 1A and first resin member 1B and loads the first member 1A and the first resin member 1B in the first press apparatus 10. As illustrated in FIG. 5, the loading head 34H grips the first member 1A aligned in the member groove 338a at the position "1" of FIG. 5 and the first resin member 1B at the position "2" of FIG. 5. Then, the gripped first member 1A and first resin member 1B may be loaded on the first press apparatus 10.

Next, in the semiconductor package molding system according to the present exemplary embodiment, an operation S3 may be performed in which the first press apparatus 10 melts, presses, and molds the transferred first resin member 1B with respect to the first member 1A.

As illustrated in FIG. 5, the molding unit 11 of the first press apparatus 10 combines the lower plate 11B and the upper plate 11A on which the first member 1A and the first resin member 1B are loaded, melts the first resin member 1B at high temperature and high pressure to fill a cavity that is a space formed between the upper plate 11A and the lower plate 11B, and cures the combined upper and lower plates 11A and 11B into the first mold 1C.

Typically, the molding operation S3 may require a lot of time. Accordingly, in the semiconductor package molding system according to the present exemplary embodiment, to save production time, while the first mold 1C is molded in the first press apparatus 10, an operation S4 may be performed in which the second resin member alignment apparatus 32 and the member alignment apparatus 33 secondarily align the second member 2A and the second resin member 2B.

As illustrated in FIG. 6, the second resin member 2B is input to the second resin member container 321 and aligned to the linear line 323 by the second resin member aligner 324, and the second resin member 2B is accommodated in the second resin member stage 325 by the second resin member individual transfer unit 326. Then, the second resin member 2B is transferred to the second resin member standby position L2 by the second resin member stage elevation unit 327 and aligned thereto.

Also, as illustrated in FIG. 7, the second member magazine 2AM loaded with the second member 2A is input to the second member magazine input layer 332 and transferred thereon. The second member magazine 2AM gripped by the magazine holder MH is sequentially elevated along the magazine elevation unit 335. The second member 2A is pushed by the member pusher P1 of the member individual transfer unit 336 to be individually transferred by passing through the member path 33Ra formed in the wall surface of the member magazine loading room 33R. As illustrated in FIG. 6, the second member 2A that is individually transferred by passing through the member path 33Ra may be transferred along the member guide 337 and symmetrically accommodated in the member groove 338a of the member rotation stage 338 that repeats reverse.

In the semiconductor package molding system according to the present exemplary embodiment, an operation S5 may be performed in which the loader 34 picks up the aligned second member 2A and second resin member 2B and loads the second member 2A and the second resin member 2B in the second press apparatus 20. As illustrated in FIG. 5, the loading head 34H grips the second member 2A aligned in the member groove 338a at the position "1" of FIG. 5 and the second resin member 2B at the position "4" of FIG. 5. Then, the gripped second member 2A and second resin member 2B may be loaded on the second press apparatus 20.

Next, in the semiconductor package molding system according to the present exemplary embodiment, an operation S6 may be performed in which the second press apparatus 20 melts, presses, and molds the transferred second resin member 2B with respect to the second member 2A.

As illustrated in FIG. 5, the molding unit 21 of the second press apparatus 20 combines the lower plate 21B and the upper plate 21A on which the second member 2A and the second resin member 2B are loaded, melts the second resin member 2B at high temperature and high pressure to fill a cavity that is a space formed between the upper plate 21A and the lower plate 21B, and cures the combined upper and lower plates 11A and 11B into the second mold 2C.

Typically, the molding operation S6 may require a lot of time. Accordingly, in the semiconductor package molding system according to the present exemplary embodiment, to save production time, while the second mold 2C is molded in the second press apparatus 20, an operation S7 may be performed in which the unloader 41 unloads the molded first mold 1C to the degater 42.

As illustrated in FIG. 4, when the molding work of the first mold 1C is completed, the unloading head 41H may grip the molded first mold 1C in the first press apparatus 10, transfer the first mold 1C to the degater 42, and unload the first mold 1C on the degater 42.

In the semiconductor package molding system according to the present exemplary embodiment, an operation S8 may be performed in which the degater 42 cuts the gate portion of the transferred first mold 1C. As illustrated in FIG. 4, the first mold 1C unloaded at the accommodation position L3 of FIG. 4 by the unloading head 41H is transferred to the degating position L4 by the degating stage 421. For example, in the semiconductor package molding system according to the present exemplary embodiment, a degating process of pressing and cutting the gate portion using the degating press 422 may be performed.

Also, in the semiconductor package molding system according to the present exemplary embodiment, an operation S9 may be performed in which the mold alignment apparatus 43 loads the first mold 1C with the gate portion that is cut on the first mold magazine 1CM.

The mold 1C having completed the degating process may be individually transferred to the drawing position L5 of FIG. 4 by the pickup unit 431. As illustrated in FIG. 8, when the empty first mold magazine 1CM0 is input to the empty mold magazine input layer 1431, the empty first mold magazine 1CM0 is transferred to the empty magazine standby position by the transfer finger F. The empty first mold magazine 1CM0 is gripped by the magazine holder MH and sequentially elevated by the magazine elevation unit 1432. The empty first mold magazine 1CM0 passes through the mold path 43Ra formed in the wall surface. The first mold 1C that is individually transferred may be sequentially stacked in the first mold magazine 1CM by the mold pusher P2. The first mold magazine 1CM filled with the first mold 1C is elevated by the magazine elevation unit 1432 and transferred to the first mold output layer 1433. The first mold magazine 1CM filled with the first mold 1C may be selectively output to the outside from the first mold output layer 1433.

In the semiconductor package molding system according to the present exemplary embodiment, an operation S10 may be performed in which the unloader 41 unloads the molded second mold 2C on the degater 42. As illustrated in FIG. 4, when the molding work of the second mold 2C is completed, the unloading head 41H grips the molded first mold 2C in the second press apparatus 20, transfers the gripped first mold 2C to the degater 42, and unloads the first mold 2C thereon.

In the semiconductor package molding system according to the present exemplary embodiment, an operation S11 may be performed in which the degater 42 cuts the gate portion of the transferred second mold 2C. As illustrated in FIG. 4, the second mold 2C unloaded at the accommodation position L3 of FIG. 4 by the unloading head 41H is transferred to the degating position L4 by the degating stage 421. The semiconductor package molding system according to the present exemplary embodiment may perform a degating process to press and cut the gate portion using the degating press 422.

In the semiconductor package molding system according to the present exemplary embodiment, an operation S12 may be performed in which the mold alignment apparatus 43 loads the second mold 2C in which the gate portion is cut in the second mold magazine 2CM.

The mold 2C having completed the degating process may be individually transferred to the drawing position L5 of FIG.

4 by the pickup unit 431. As illustrated in FIG. 8, when the empty second mold magazine 2CM0 is input to the empty mold magazine input layer 1431, the empty second mold magazine 2CM0 is transferred to the empty magazine standby position by the transfer finger F. The empty second mold magazine 2CM0 is gripped by the magazine holder MH and sequentially elevated by the magazine elevation unit 1432. The empty second mold magazine 2CM0 passes through the mold path 43Ra formed in the wall surface. The second mold 2C that is individually transferred may be sequentially stacked in the second mold magazine 2CM by the mold pusher P2. The second mold magazine 2CM filled with the second mold 2C is elevated by the magazine elevation unit 1432 and transferred to the second mold output layer 1434. The second mold magazine 2CM filled with the second mold 2C may be selectively output to the outside from the second mold output layer 1434.

Having described exemplary embodiments of the present inventive concept, it is further noted that it is readily apparent to those of reasonable skill in the art that various modifications may be made without departing from the spirit and scope of the invention which is defined by the metes and bounds of the appended claims.

What is claimed is:

1. A semiconductor package molding system comprising:
a press unit which comprises:
at least one first press apparatus which is adapted to press a first resin member against a first member to mold a first mold; and
at least one second press apparatus which is adapted to press a second resin member against a second member to mold a second mold;
a loading apparatus which is adapted to load the first member and the first resin member on the first press apparatus and the second member and the second resin member on the second press apparatus, wherein the loading apparatus comprises:
a first resin member alignment apparatus which is adapted to align the first resin member to a first resin member standby position,
a second resin member alignment apparatus which is adapted to align the second resin member to a second resin member standby position,
a member alignment apparatus which is adapted to sequentially align the first member and the second member to a member standby position, wherein the member alignment apparatus comprises:
a member magazine loading room which comprises:
a first member magazine input layer which is adapted to transfer a first member magazine including the first member therein to a first elevation standby position; and
a second member magazine input layer disposed on the first member magazine input layer and which is adapted to transfer a second member magazine including the second member therein to a second elevation standby position;
a loader which is adapted to primarily pick up the first member aligned to the member standby position and the first resin member aligned to the first resin member standby position, transfer the picked up first member and first resin member to the first press apparatus, secondarily pick up the second member aligned to the member standby position and the second resin member aligned to the second resin member standby position and transfer the picked up second member and second resin member to the second press apparatus;
an unloading apparatus which is adapted to unload the molded first mold from the first press apparatus and the molded second mold from the second press apparatus; and
a control unit which is adapted to apply a control signal to the press unit, the loading apparatus, and the unloading apparatus.

2. The semiconductor package molding system of claim 1, wherein the first member and the second member have a same specification as one another and comprise a lead frame and a printed circuit board.

3. The semiconductor package molding system of claim 1, wherein the first resin member and the second resin member are formed of different materials from one another.

4. The semiconductor package molding system of claim 1, further comprising a case for housing the first press apparatus, the second press apparatus, the loading apparatus, the unloading apparatus, and the control unit therein.

5. The semiconductor package molding system of claim 4, wherein the case comprises;
at least one main case surrounding part of the loading apparatus and the unloading apparatus; and at least one module case detachably connected to the main case to facilitate additional installation of the first press apparatus or the second press apparatus and surrounding the first press apparatus or the second press apparatus.

6. The semiconductor package molding system of claim 1, wherein the first resin member alignment apparatus comprises:
a first resin member container which is adapted to temporarily store a plurality of first resin members that are input, in which a first resin member input hole is formed in an upper surface thereof and a first resin member output hole is formed in a lower surface thereof;
a first resin member aligner which is adapted to align the first resin member output through the first resin member output hole to a linear line using a vibrator for vibrating the first resin member in one direction;
a first resin member stage which includes at least one first resin member groove for accommodating the first resin member therein;
a first resin member individual transfer unit which is adapted to individually transfer the first resin member aligned to the linear line to the first resin member stage; and
a first resin member stage transferring unit which is adapted to transfer the first resin member stage to the first resin member standby position.

7. The semiconductor package molding system of claim 1, wherein the second resin member alignment apparatus comprises:
a second resin member container which is adapted to temporarily store a plurality of second resin members that are input, in which a second resin member input hole is formed in an upper surface thereof and a second resin member output hole is formed in a lower surface thereof;
a second resin member aligner which is adapted to align the second resin member output through the second resin member output hole to a linear line using a vibrator for vibrating the second resin member in one direction;
a second resin member stage which includes at least one second resin member groove for accommodating the second resin member therein;
a second resin member individual transfer unit which is adapted to individually transfer the second resin member aligned to the linear line to the second resin member stage; and a second resin member stage transferring unit which is adapted to transfer the second resin member stage to the second resin member standby position.

8. The semiconductor package molding system of claim 1, wherein:
the member magazine loading room further comprises:
a first member magazine output layer which is adapted to transfer an empty first member magazine to an empty magazine output position;
a second member magazine output layer which is adapted to transfer an empty second member magazine to an empty magazine output position;
a magazine holder which is adapted to grip the first member magazine and the second member magazine;
a magazine elevation unit which is adapted to sequentially elevate the magazine holder; and
a member individual transfer unit which comprises:
a member pusher installed at an escape height for the first member and the second member respectively loaded in the first member magazine,
wherein the second member magazine is adapted to be individually transferred by passing through a member path formed in a wall surface of the member magazine loading room; and
a pusher actuator which is adapted to move the member pusher back and forth;
a member guide which is adapted to guide the first member and the second member having passed through the member path; and
a member rotation stage which is adapted to rotate the first member or the second member to reverse a direction of the first or second member, wherein the member rotation stage includes a member groove in which the first member or the second member guided by the member guide is accommodated therein.

9. The semiconductor package molding system of claim 1, wherein the loader comprises:
a loading head which comprises:
a member holder which is adapted to grip the first member or the second member; and
a resin holder which is adapted to grip the first resin member or the second resin member, and
a loading robot which is adapted to selectively move the loading head in an X-axis direction, a Y-axis direction, and a Z-axis direction.

10. The semiconductor package molding system of claim 1, wherein the unloading apparatus comprises:
an unloader which is adapted to pick up a molded first mold from the first press apparatus, transfer the first mold to an accommodation position, pick up a molded second mold from the second press apparatus and transfer the second mold to the accommodation position;
a degater which comprises:
a degating stage installed at the accommodation position and which is adapted to transfer a transferred first mold or second mold to a degating position; and
a degating press installed at the degating position and which is adapted to press and cut a gate portion of the transferred first mold or second mold; and
a mold alignment apparatus which is adapted to selectively align the first mold or the second mold cut at the degater to a first mold magazine and a second mold magazine.

11. The semiconductor package molding system of claim 10, wherein the unloader comprises:
an unloading head comprising a mold holder which is adapted to grip the first mold or the second mold; and
an unloading robot which is adapted to selectively move the unloading head in an X-axis direction, a Y-axis direction, and a Z-axis direction.

12. The semiconductor package molding system of claim 10, wherein the mold alignment apparatus comprises:
a pickup unit which is adapted to individually transfer the first mold or the second mold cut at the degater to a drawing position;
a mold individual transfer unit which comprises:
a mold pusher installed at the drawing position and which is adapted to individually transfer the first mold or the second mold located at the drawing position; and
a pusher actuator which is adapted to move the mold pusher back and forth; and
a mold magazine loading room which comprises: an empty mold magazine input layer which is adapted to transfer an empty first mold magazine and an empty second mold magazine to an empty magazine standby position;
a magazine holder which is adapted to grip the empty first mold magazine and the empty second mold magazine;
a magazine elevation unit which is adapted to sequentially elevate the magazine holder;
a first mold output layer which is adapted to transfer the first mold magazine to a first mold magazine output position; and
a second mold output layer which is adapted to transfer the second mold magazine to a second mold magazine output position.

13. A semiconductor package molding system comprising:
a press unit which comprises:
at least one first press apparatus which is adapted to press a first resin member against a first member to mold a first mold; and
at least one second press apparatus which is adapted to press a second resin member against a second member to mold a second mold;
a loading apparatus which is adapted to load the first member and the first resin member on the first press apparatus and the second member and the second resin member on the second press, wherein the loading apparatus comprises:
a first resin member alignment apparatus which is adapted to align the first resin member;
a second resin member alignment apparatus which is adapted to align the second resin member;
a member alignment apparatus which is adapted to align the first member and the second member to a member standby position, wherein the member alignment apparatus comprises:
a member magazine loading room which comprises:
a first member magazine input layer which is adapted to transfer a first member magazine including the first member therein to a first elevation standby position; and
a second member magazine input layer disposed on the first member magazine input layer and which is adapted to transfer a second member magazine including the second member therein to a second elevation standby position;
a loader which is adapted to pick up the first member and the first resin member, transfer the first member and the first resin member to the first press apparatus, pick up the second member and the second resin member and transfer the second member and the second resin member to the second press apparatus;

an unloader which is adapted to pick up the first mold molded at the first press apparatus and to pick up the second mold molded at the second press apparatus;

a degater which is adapted to receive the first mold and the second mold from the unloader and to press and cut a gate portion of the transferred first mold or second mold; and a mold alignment apparatus which is adapted to selectively align the first mold or second mold cut at the degater to a first mold magazine and a second mold magazine, wherein the first resin member and the second resin member are formed of different materials from one another.

14. The semiconductor package molding system of claim 13, further comprising a control unit which is adapted to receive a first resin member alignment signal from the first resin member alignment apparatus and a first member alignment signal from the member alignment apparatus, output a first member/first resin member pickup command signal and a first press apparatus loading command signal to the loader when the alignment of the first resin member and the first member is checked, receive a second resin member alignment signal from the second resin member alignment apparatus and a second member alignment signal from the member alignment apparatus and output a second member/second resin member pickup command signal and a second press apparatus loading command signal to the loader when the alignment of the second resin member and the second member is checked.

15. The semiconductor package molding system of claim 4, wherein the case includes a door and a window therein for a user to be able to check operation states within the case with a naked eye.

16. The semiconductor package molding system of claim 6, wherein the first resin member individual transfer unit includes a drop rod which is adapted to individually grip the first resin member and advance toward a through hole formed in a lower plate of the first resin member individual transfer unit to drop the first resin member through the though hole to the first resin member stage.

17. The semiconductor package molding system of claim 6, further comprising:

a case for housing the first press apparatus, the second press apparatus, the loading apparatus, the unloading apparatus, and the control unit therein; and a rail located outside of the case, wherein the first resin member container is slidable along the rail to input the first resin member into the case from the outside of the case.

18. The semiconductor package molding system of claim 7, further comprising:

a case for housing the first press apparatus, the second press apparatus, the loading apparatus, the unloading apparatus, and the control unit therein; and a rail located outside of the case, wherein the second resin member container is slidable along the rail to input the second resin member into the case from the outside of the case.

19. The semiconductor package molding system of claim 1, wherein the first member magazine input layer is adapted to transfer the first member magazine including the first member therein to the first elevation standby position by a first transfer finger disposed in the first member magazine input layer, and wherein the second member magazine input layer is adapted to transfer the second member magazine including the second member therein to the second elevation standby position by a second transfer finger disposed in the second member magazine input layer.

20. The semiconductor package molding system of claim 13, wherein the first member magazine input layer is adapted to transfer the first member magazine including the first member therein to the first elevation standby position by a first transfer finger disposed in the first member magazine input layer, and wherein the second member magazine input layer is adapted to transfer the second member magazine including the second member therein to the second elevation standby position by a second transfer finger disposed in the second member magazine input layer.

* * * * *